US012575208B2

(12) United States Patent
Kuo et al.

(10) Patent No.: US 12,575,208 B2
(45) Date of Patent: Mar. 10, 2026

(54) IMAGE SENSOR

(71) Applicant: VisEra Technologies Company Ltd., Hsin-Chu City (TW)

(72) Inventors: Shin-Hong Kuo, Hsin-Chu City (TW); Po-Hsiang Wang, Hsin-Chu City (TW)

(73) Assignee: VISERA TECHNOLOGIES COMPANY LTD., Hsin-Chu City (TW)

( * ) Notice: Subject to any disclaimer, the term of this patent is extended or adjusted under 35 U.S.C. 154(b) by 504 days.

(21) Appl. No.: 18/179,179

(22) Filed: Mar. 6, 2023

(65) Prior Publication Data

US 2024/0178251 A1 May 30, 2024

Related U.S. Application Data

(60) Provisional application No. 63/429,005, filed on Nov. 30, 2022.

(51) Int. Cl.
H10F 39/00 (2025.01)
G02B 3/08 (2006.01)

(52) U.S. Cl.
CPC ........... H10F 39/8063 (2025.01); G02B 3/08 (2013.01); H10F 39/8053 (2025.01); H10F 39/806 (2025.01)

(58) Field of Classification Search
CPC ..... H10F 39/806; H10F 39/8063; G02B 3/02; G02B 3/08
See application file for complete search history.

(56) References Cited

U.S. PATENT DOCUMENTS

| | | | | |
|---|---|---|---|---|
| 7,733,567 B2 * | 6/2010 | Li | ........................... | G02B 1/118 |
| | | | | 359/620 |
| 2002/0005471 A1 * | 1/2002 | Suzuki | .................. | H10F 39/806 |
| | | | | 257/E31.128 |
| 2015/0008553 A1 * | 1/2015 | Choi | ....................... | H10F 77/40 |
| | | | | 257/432 |
| 2020/0340859 A1 | 10/2020 | Meng et al. | | |
| 2021/0223104 A1 | 7/2021 | Siddique et al. | | |
| 2022/0357645 A1 | 11/2022 | Sisto et al. | | |

FOREIGN PATENT DOCUMENTS

| | | |
|---|---|---|
| JP | H08297204 | 11/1996 |
| JP | H10111420 | 4/1998 |
| JP | 2011089895 | 5/2011 |
| JP | 2019500612 | 1/2019 |
| TW | 202217371 | 5/2022 |
| TW | 202238178 | 10/2022 |
| WO | 2015037306 | 3/2015 |
| WO | 2017138668 | 8/2017 |

* cited by examiner

*Primary Examiner* — Matthew C Landau
*Assistant Examiner* — Nora T. Nix
(74) *Attorney, Agent, or Firm* — LIU & LIU

(57) ABSTRACT

The present disclosure provides an image sensor including a photodiode, a micro lens above the photodiode, a color filter between the photodiode and the micro lens, and a polyhedron lens film above the micro lens. The polyhedron lens film includes a plurality of polyhedron lens units protruding away from the photodiode, in which a plurality of orthogonal projections of the plurality of the polyhedron lens units are within an orthogonal projection of the photodiode. Each of the polyhedron lens units includes a bottom facet facing the photodiode, a top facet opposite to the bottom facet, and at least one side facet connecting the top facet and the bottom facet.

20 Claims, 16 Drawing Sheets

20

452a

452b

452c

452f

452e

452d

654a

652a

654b

652b

654c

652c

654d

652d

752b

752a

750

IMAGE SENSOR

CROSS-REFERENCE TO RELATED APPLICATION

This application claims priority to U.S. Provisional Application Ser. No. 63/429,005, filed Nov. 30, 2022, which is herein incorporated by reference in its entirety.

BACKGROUND

Field of Invention

The present disclosure relates to an image sensor. More particularly, the present disclosure relates to the image sensor with a polyhedron lens film.

Description of Related Art

Image sensors are used in various imaging devices such as digital camera, medical imaging equipment, thermal imaging equipment, radar, and so on. An image sensor typically includes a micro lens, a color filter, and multiple photodiodes. However, before the incident light reaches the photodiodes, the incident light may be reflected by other components of the image sensor, and the energy received by the photodiodes may be uneven. As a result, the performance of the image sensor is degraded.

SUMMARY

According to some embodiments of this disclosure, an image sensor includes a photodiode, a micro lens above the photodiode, a color filter between the photodiode and the micro lens, and a polyhedron lens film above the micro lens, in which the polyhedron lens film includes a plurality of polyhedron lens units protruding away from the photodiode. A plurality of orthogonal projections of the plurality of the polyhedron lens units are within an orthogonal projection of the photodiode. Each of the plurality of the polyhedron lens units includes a bottom facet facing the photodiode, a top facet opposite to the bottom facet, and at least one side facet connecting the top facet and the bottom facet.

In some embodiments, an orthogonal projected area of one of the polyhedron lens units onto the photodiode is smaller than or equal to a quarter of an orthogonal projected area of the micro lens onto the photodiode.

In some embodiments, a bottom width of one of the polyhedron lens units approaches to a wavelength of an incident light into the photodiode.

In some embodiments, a ratio between a bottom width and a height of one of the polyhedron lens units is in a range of 1:2 to 1:9.

In some embodiments, a bottom width of one of the polyhedron lens units is larger than a top width, and an angle between the side facet and the bottom facet of the polyhedron lens unit is in a range of 25° to 89°.

In some embodiments, a distance between the bottom facets of adjacent two of the polyhedron lens units is in a range of 0 nm to half of a bottom width of one of the polyhedron lens units.

In some embodiments, the top facet of one of the polyhedron lens units is a flat surface parallel to the bottom facet.

In some embodiments, the top facet of one of the polyhedron lens units includes a microstructure, and a width of the microstructure is smaller than a top width of the polyhedron lens unit.

In some embodiments, the microstructure protrudes away from the photodiode.

In some embodiments, the microstructure recesses toward the photodiode.

In some embodiments, a shape of the microstructure is different from that of the polyhedron lens unit.

In some embodiments, a ratio between a height of the microstructure and that of the polyhedron lens unit is smaller than or equal to 0.8.

In some embodiments, the polyhedron lens film includes a combination of at least two shapes of the polyhedron lens units.

In some embodiments, the polyhedron lens units form a two-dimensional array along a first direction and a second direction perpendicular to the first direction.

In some embodiments, the image sensor further includes a capping layer conformally covering the polyhedron lens film, in which a refractive index of the polyhedron lens film is larger than that of the capping layer.

In some embodiments, the image sensor further includes a substrate below the polyhedron lens film, in which a refractive index of the substrate approaches to that of the polyhedron lens film.

In some embodiments, the image sensor further includes an optical layer between the micro lens and the polyhedron lens film, in which a refractive index of the optical layer is smaller than that of the micro lens.

In some embodiments, the image sensor further includes an optical layer between the micro lens and the polyhedron lens film, in which the optical layer includes an IR-cut filter, an UV-cut filter, a reflective coating, an anti-reflective coating, or combinations thereof.

In some embodiments, the image sensor further includes an optical layer between the micro lens and the polyhedron lens film, an adhesive layer between the micro lens and the optical layer, and a buffer layer between the micro lens and the adhesive layer, in which a refractive index of the buffer layer is smaller than that of the adhesive layer.

In some embodiments, the image sensor further includes an optical layer between the micro lens and the polyhedron lens film. The optical layer includes a first multilayer film, a substrate between the micro lens and the first multilayer film, and a second multilayer film between the micro lens and the substrate, in which a refractive index of the second multilayer film is smaller than that of the micro lens.

According to the above-mentioned embodiments, the image sensor of this disclosure includes the polyhedron lens film above the micro lens and the photodiode. The polyhedron lens units of the polyhedron lens film protrude away from the photodiode to eliminate the total internal reflection, which reduces the flare of the image sensor. The orthogonal projections of multiple polyhedron lens units are within the orthogonal projection of one photodiode, leading to high efficiency of light transmittance and improved optical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
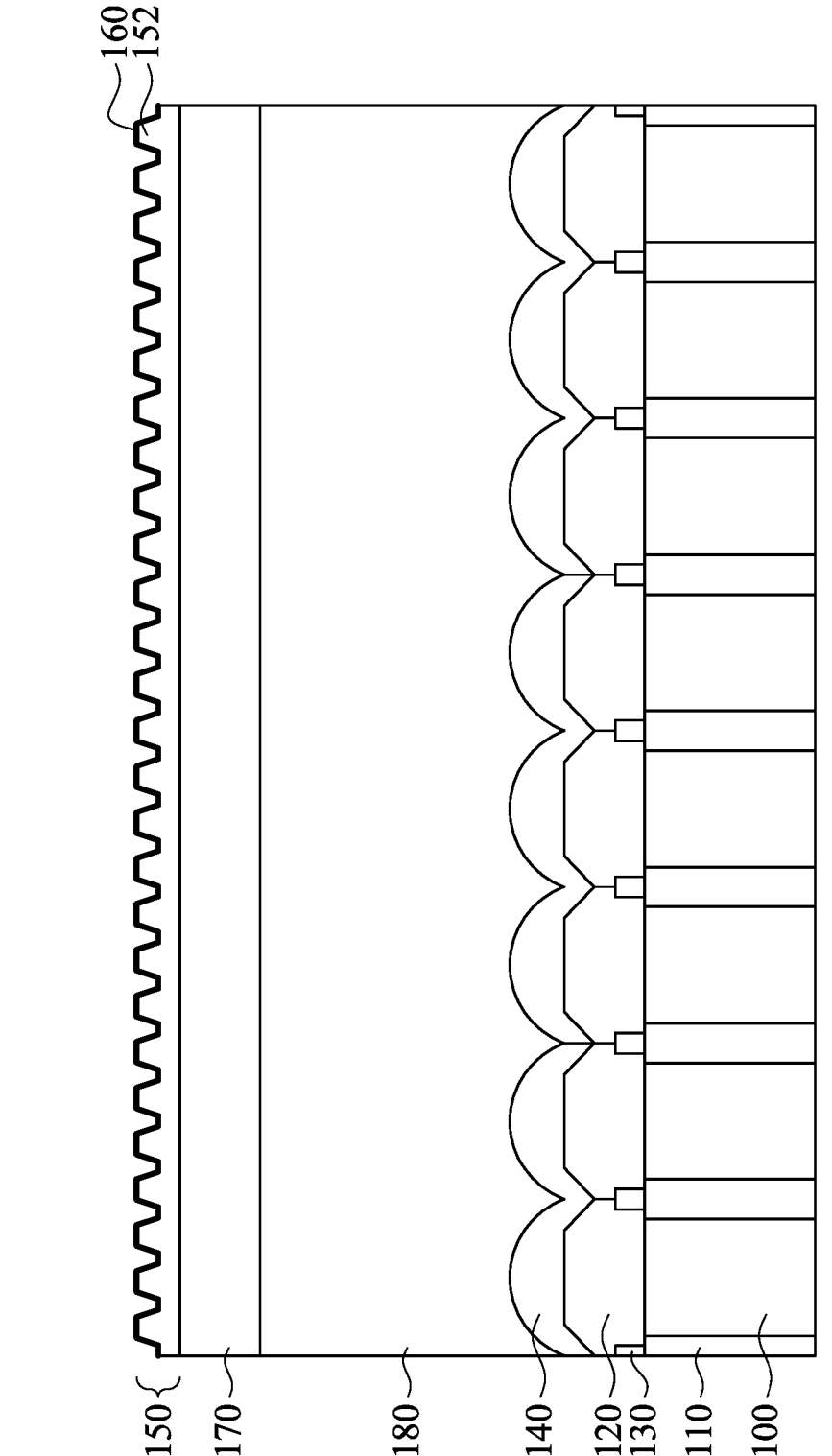
FIG. 1 illustrates a cross-sectional view of an image sensor according to one embodiment of this disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an image sensor including a polyhedron lens film above a micro lens, a color filter, and a photodiode, in which the polyhedron lens film includes polyhedron lens units protruding away from the photodiode. The polyhedron lens film increases the light transmittance and reduces the total internal reflection of the image sensor, leading to reduced flare and improved performance of the image sensor. In addition, the orthogonal projections of multiple polyhedron lens units onto the photodiode are within the area of one photodiode (i.e., the orthogonal projections of the polyhedron lens are within the orthogonal projection of the photodiode), which increases the light transmittance efficiency and provides good optical performance.

According to one embodiment of the present disclosure, FIG. 1 illustrates a cross-sectional view of an image sensor 10. The image sensor 10 includes photodiodes 100 separated by isolation structures 110, color filters 120 above the photodiodes 100, micro lenses 140 above the photodiodes 100, and a polyhedron lens film 150 above the micro lenses 140. One of the color filters 120 is disposed between one of the photodiodes 100 and one of the micro lenses 140, so that the incident light of the image sensor 10 is focused by the micro lens 140 and filtered by the color filter 120 before reaching the photodiode 100. In some embodiments, the image sensor may include a metal grid 130 between the isolation structure 110 and the color filter 120 to prevent the incident light from entering the isolation structure 110, thereby reducing the risk of light cross-talk between adjacent photodiodes 100.

The polyhedron lens film 150 above the micro lens 140 includes polyhedron lens units 152 protruding away from the photodiodes 100. Since the polyhedron lens film 150 is disposed closer to the incident surface of the image sensor 10 than the micro lenses 140, the polyhedron lens units 152 of the polyhedron lens film 150 increase the transmittance of the light and eliminate the total internal reflection on the interface between the image sensor 10 and the external environment. As a result, the flare of the image sensor 10 is reduced, which improves the optical performance of the image sensor 10.

Figure 2:
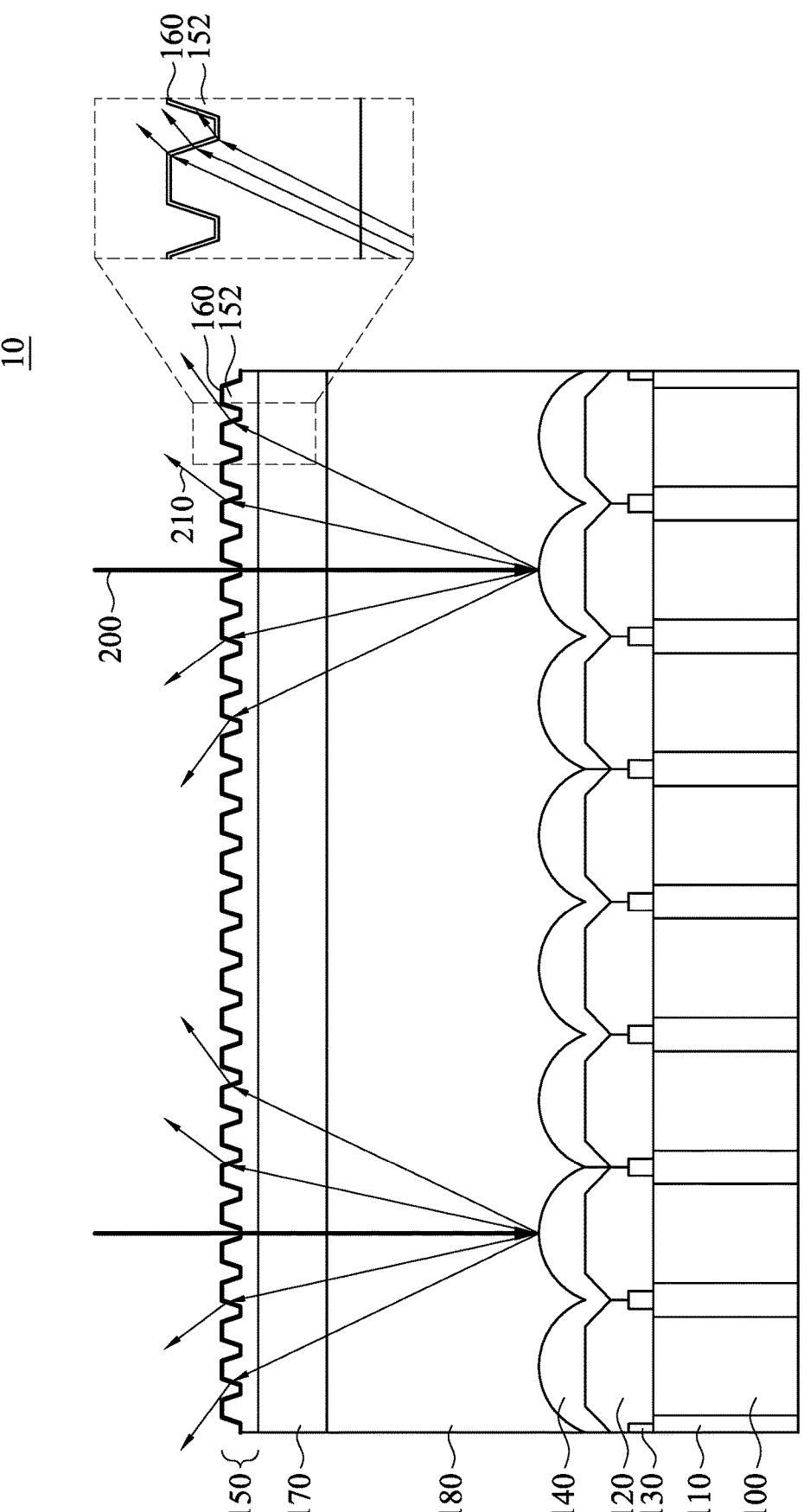
FIG. 2 illustrates light paths in a cross-sectional view of the image sensor shown in FIG. 1.

To clearly describe the increased transmittance and eliminated total internal reflection caused by the polyhedron lens film 150, FIG. 2 illustrates the light paths in the image sensor 10 of FIG. 1. As shown in FIG. 2, after the incident light 200 enters the image sensor 10, the incident light 200 may be reflected by the components, such as the micro lens 140, above the photodiodes 100 and become the reflective light 210. When the reflective light 210 reaches the polyhedron lens film 150, the polyhedron lens film 150 refracts the reflective light 210 out of the image sensor 10. Therefore, the possibility of the reflective light 210 reaching the photodiodes 100 may be significantly decreased, which provides the image with high quality. If the image sensor 10 does not include the polyhedron lens film 150 above the micro lens 140, the reflective light 210 may be reflected again on the interface between the image sensor 10 and the external environment, leading to the undesirable signal of the photodiodes 100 and the flare image of the image sensor 10.

Referring back to FIG. 1, the polyhedron lens film 150 includes a plurality of polyhedron lens units 152 protruding away from the photodiodes 100. Specifically, the orthogonal projections of several polyhedron lens units 152 are within the orthogonal projection of one photodiode 100, so that one photodiode 100 corresponds to more than one polyhedron lens units 152. The multiple polyhedron lens units 152 corresponding to one photodiode 100 provides high efficiency of light transmittance and improves the optical performance.

In some embodiments, the orthogonal projected area of one polyhedron lens unit 152 onto the photodiode 100 may be smaller than the orthogonal projected area of one micro lens 140 onto the photodiode 100. For example, the orthogonal projected area of one polyhedron lens unit 152 may be smaller than or equal to a quarter of that of one micro lens 140. In such embodiments, one photodiode 100 and one micro lens 140 may correspond to at least four polyhedron lens units 152.

Figure 3A:
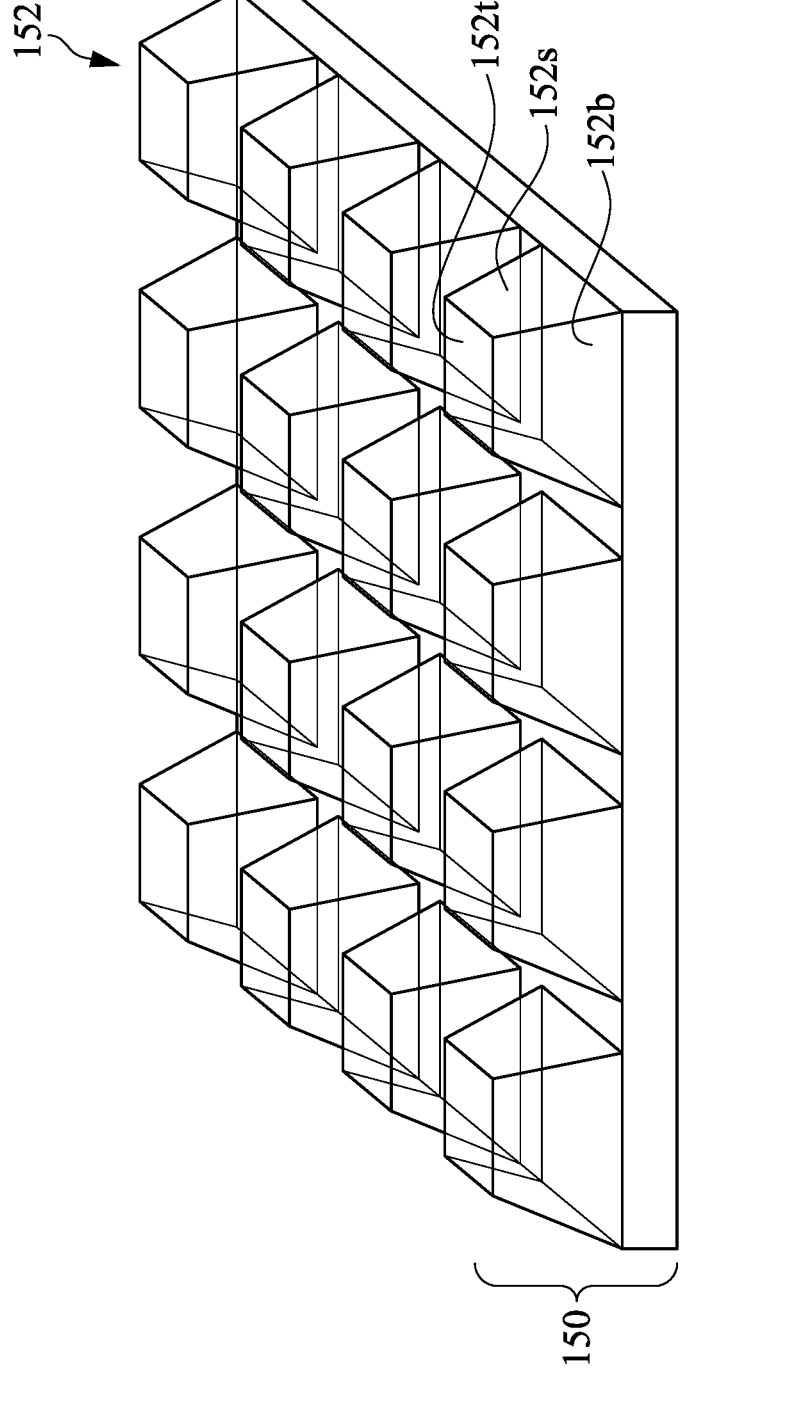
FIGS. 3A-3C illustrate a three dimensional view, a partial cross-sectional view, and a partial top view of the polyhedron lens film shown in FIG. 1.
Figure 3A:
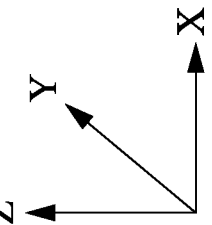
Figure 3C:
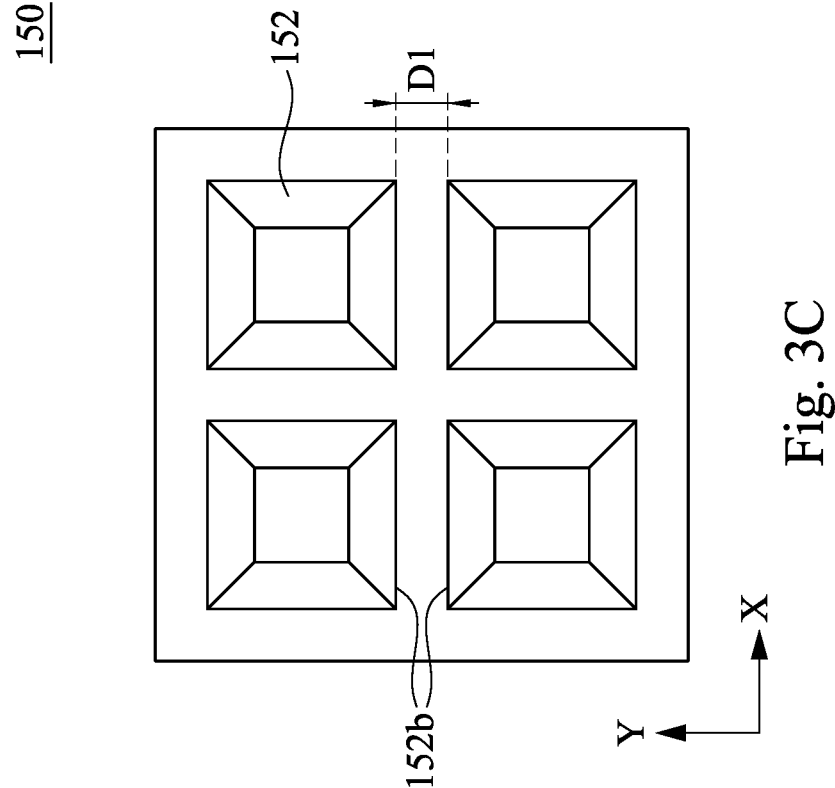
Figure 3B:
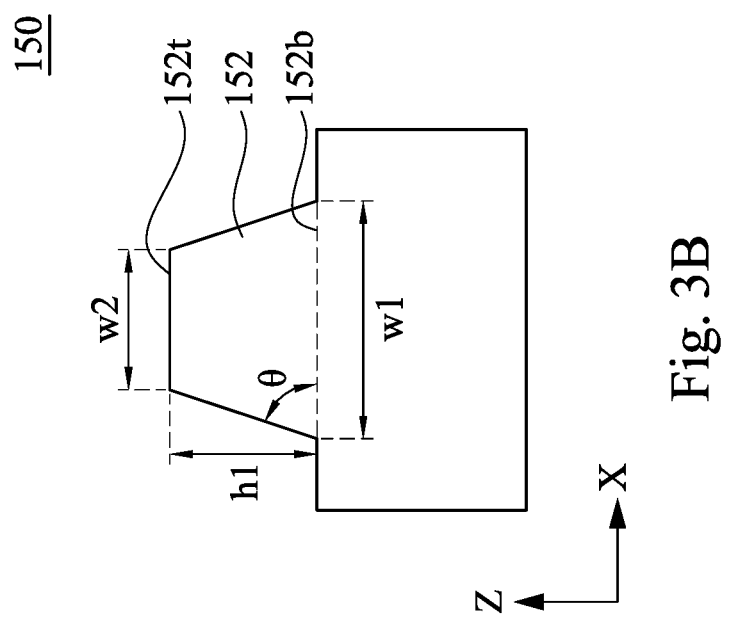

FIG. 3A illustrates a three dimensional view of the polyhedron lens film 150 shown in FIG. 1 to show further details of the polyhedron lens unit 152. FIG. 3B and FIG. 3C respectively illustrates a partial cross-sectional view on the x-z plane and a partial top view on the x-y plane of the polyhedron lens film 150 shown in FIG. 3A. As shown in FIGS. 3A-3C, each polyhedron lens unit 152 includes a bottom facet 152b, a top facet 152t opposite to the bottom facet 152b, and side facets 152s connecting the top facet 152t and the bottom facet 152b. When the polyhedron lens film 150 is disposed in the image sensor 10 in FIG. 1, the bottom facet 152b faces the photodiode 100. A bottom width w1 of the polyhedron lens unit 152 is defined as the maximum width of the bottom facet 152b along the X-axis or the Y-axis. A top width w2 of the polyhedron lens unit 152 is defined as the maximum width of the top facet 152t along the same direction of the bottom width w1. A height h1 of the polyhedron lens unit 152 is defined as the distance between the bottom facet 152b and the top facet 152t along the Z-axis.

In some embodiments, the bottom width w1 of the polyhedron lens unit 152 may approach to a wavelength of the incident light into the photodiode below the polyhedron lens film 150. The wavelength of the incident light into the photodiode may be referred as the operating wavelength of the photodiode. When the bottom width w1 approaches the operating wavelength, the polyhedron lens unit 152 may highly increase the light transmittance and reduce the total reflection on the interface between the polyhedron lens unit 152 and the external environment.

In some embodiments, the bottom width w1 of the polyhedron lens unit 152 may be larger than the top width w2 to increase the light transmittance and reduce the total reflection. For example, the polyhedron lens unit 152 may have a trapezoid shape on the x-z plane as shown in FIG. 3B, in which the bottom facet 152b is longer than the top facet 152t along the X-axis. In the embodiments which the bottom width w1 is larger than the top width w2, an angle θ between the side facet 152s and the bottom facet 152b of the polyhedron lens unit 152 may be in a range of 25° to 89°.

In some embodiments, the height h1 of the polyhedron lens unit 152 may be larger than the bottom width w1 to increase the light transmittance and reduce the total reflection. For example, a ratio between the bottom width w1 and the height h1 may be in a range of 1:2 to 1:9, such as 1:4, 1:6, or 1:8.

In some embodiments, the multiple polyhedron lens units 152 may form a two-dimensional array along a first direction and a second direction perpendicular to the first direction. For example, the polyhedron lens units 152 shown in FIG. 3A are arranged along the X-axis and the Y-axis. The polyhedron lens units 152 arranged in such orderly manner may refract the light out of the polyhedron lens film 150 in high efficiency, leading to lower possibility of total reflection.

In some embodiments, the multiple polyhedron lens units 152 may be separated from each other or physically contact to each other. As shown in FIG. 3C, a distance D1 is defined as the perpendicular distance between the bottom facets 152b of adjacent two polyhedron lens units 152. The distance D1 may be in a range of 0 nm to half of the bottom width w1 of the polyhedron lens unit 152 to improve the optical performance. For example, the distance D1 of the polyhedron lens units 152 may be a quarter of the bottom width w1.

In some embodiments, the top facet 152t of the polyhedron lens unit 152 may be a flat surface parallel to the bottom facet 152b, as shown in FIGS. 3A-3C. In some other embodiments, the top facet 152t of the polyhedron lens unit 152 may include a microstructure recessing or protruding from the top facet 152t. The microstructure provides several interfaces between the polyhedron lens film 150 and the external environment, which increases the possibility to refract the light out of the polyhedron lens film 150 and improves the light transmittance.

Figure 4C:
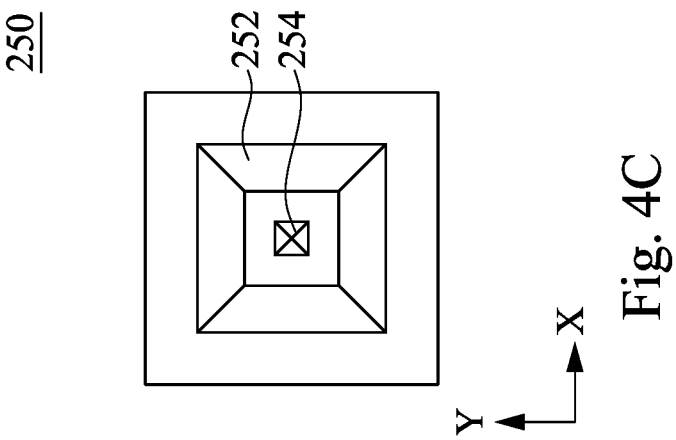
FIGS. 4A-4C illustrate a three dimensional view, a cross-sectional view, and a top view of a polyhedron lens film according to one embodiment of this disclosure.
Figure 4B:
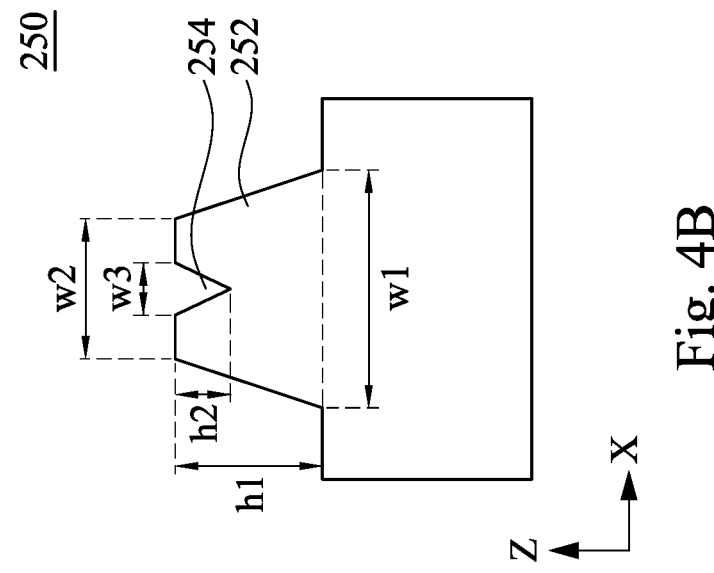
Figure 4A:
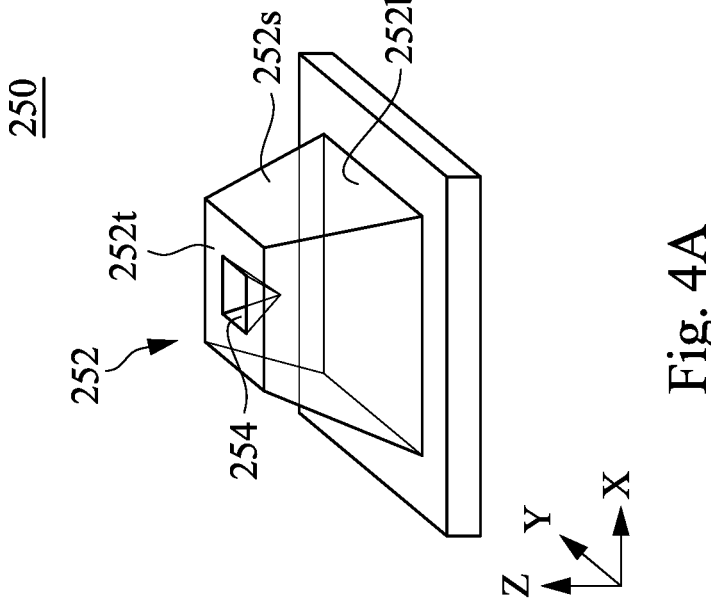

According to one embodiment of the present disclosure, FIG. 4A illustrates a three dimensional view of a polyhedron lens film 250. The polyhedron lens film 250 is illustrated with one polyhedron lens unit 252 in order to clearly describe the structure of the polyhedron lens unit 252, however, it should be understood that the polyhedron lens film 250 includes a plurality of polyhedron lens units 252. FIG. 4B and FIG. 4C respectively illustrates a cross-sectional view and a top view of the polyhedron lens film 250 shown in FIG. 4A. The polyhedron lens unit 252 includes the bottom facet 252b, the top facet 252t, and the side facets 252s connecting the top facet 252t and the bottom facet 252b.

The polyhedron lens unit 252 is similar to the polyhedron lens unit 152 shown in FIGS. 3A-3C, except for the structure of the top facet 252t. The top facet 252t of the polyhedron lens unit 252 includes a microstructure 254 recessing from the top facet 252t and toward the bottom facet 252b. In other words, when the polyhedron lens film 250 is arranged in an image sensor, the microstructure 254 recesses toward a photodiode.

Figure 5C:
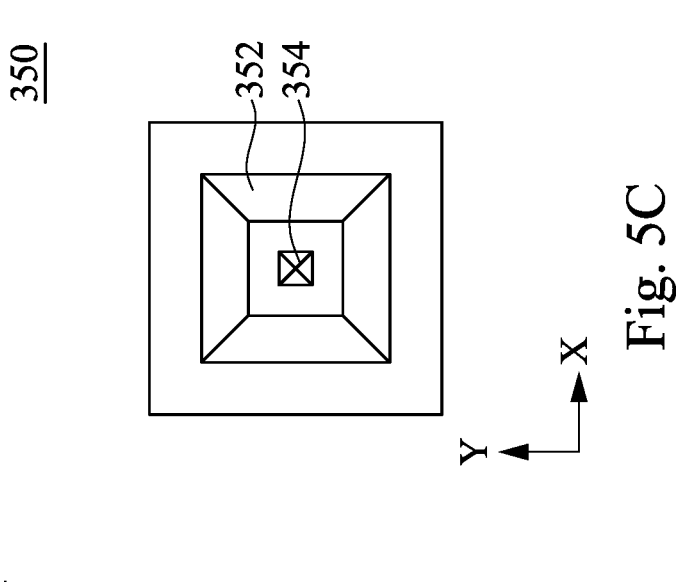
FIGS. 5A-5C illustrate a three dimensional view, a cross-sectional view, and a top view of a polyhedron lens film according to one embodiment of this disclosure.
Figure 5B:
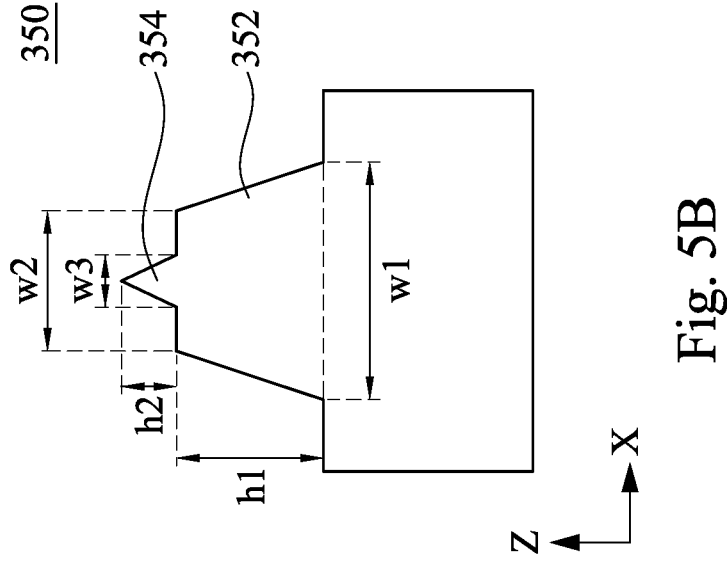
Figure 5A:
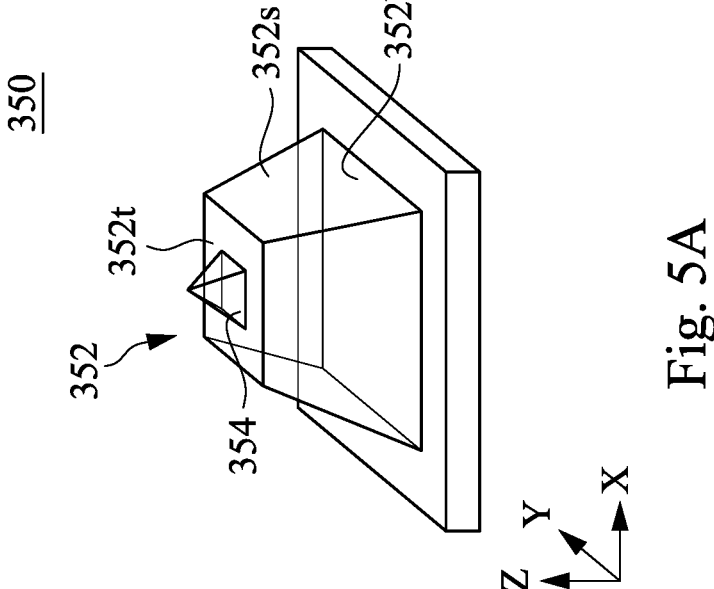
Figure 6A:
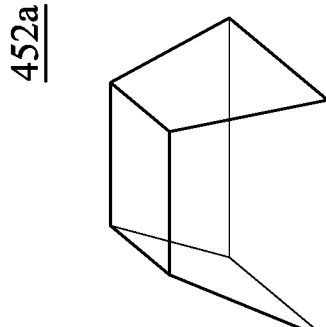
FIGS. 6A-6F illustrate three dimensional views and top views of polyhedron lens units according to some embodiments of this disclosure.
Figure 6A:
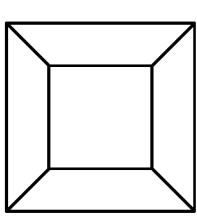
Figure 6B:
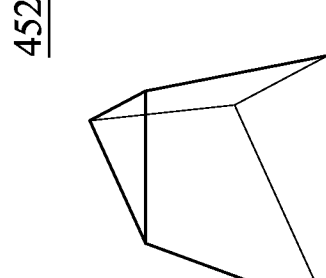
Figure 6B:
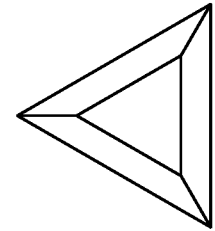
Figure 6C:
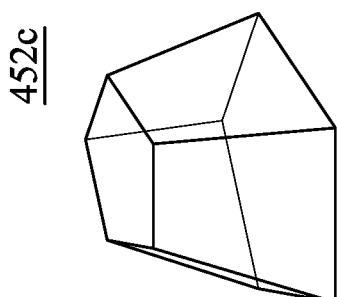
Figure 6C:
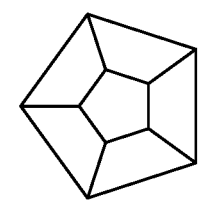
Figure 6F:
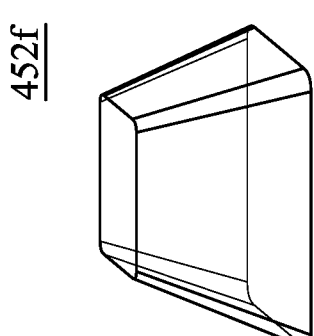
Figure 6F:
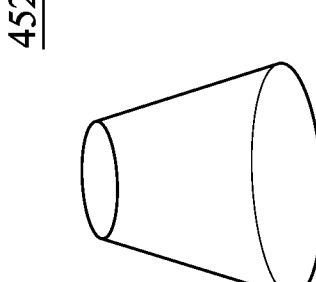
Figure 6F:
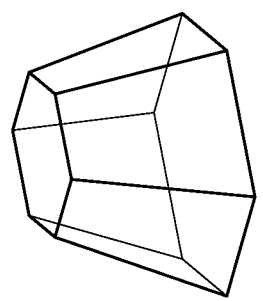
Figure 6F:
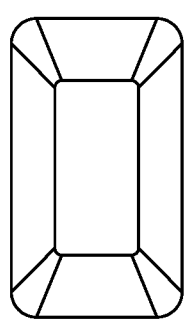
Figure 6E:
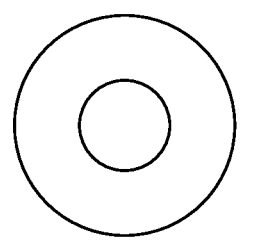
Figure 6D:
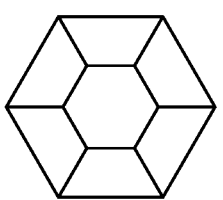

According to another embodiment of the present disclosure, FIG. 5A illustrates a partial three dimensional view of a polyhedron lens film 350. The polyhedron lens film 350 is illustrated with one polyhedron lens unit 352 in order to clearly describe the structure of the polyhedron lens unit 352, however, it should be understood that the polyhedron lens film 350 includes a plurality of polyhedron lens units 352. FIG. 5B and FIG. 5C respectively illustrates a cross-sectional view and a top view of the polyhedron lens film 350 shown in FIG. 5A. The polyhedron lens unit 352 includes the bottom facet 352b, the top facet 352t, and the side facets 352s connecting the top facet 352t and the bottom facet 352b.

The polyhedron lens unit 352 is similar to the polyhedron lens unit 152 shown in FIGS. 3A-3C, except for the structure of the top facet 352t. The top facet 352t of the polyhedron lens unit 352 includes a microstructure 354 protruding from the top facet 352t and away from the bottom facet 352b. In other words, when the polyhedron lens film 350 is arranged in an image sensor, the microstructure 354 protrudes away from a photodiode. In addition, the microstructure 354 may be formed of the same material as the polyhedron lens unit 352, so that the interface between the microstructure 354 and the polyhedron lens unit 352 is not obvious or does not exist.

As shown in FIGS. 4B and 5B, a width w3 of the microstructures 254 and 354 is defined as the maximum width along the same direction of the bottom width w1 of the polyhedron lens units 252 and 352. A height h2 of the microstructures 254 and 354 is respectively defined as the maximum depth from the top facet 252t and the maximum height from the top facet 352t along the Z-axis. In some embodiments, the width w3 may be smaller than the top width w2 of the polyhedron lens units 252 and 352, and a ratio between the height h2 and the height h1 of the polyhedron lens units 252 and 352 may be smaller than or equal to 0.8. The microstructures 254 and 354 having the above-mentioned width w3 and height h2 may improve the transmittance of the polyhedron lens units 252 and 352.

As shown in FIGS. 3A-5C, the polyhedron lens units 152, 252, and 352 have a quadrangular prism shape in the three dimensional views and a trapezoid shape in the cross-sectional views. However, the shape of the polyhedron lens unit of this disclosure is not limited to the shape of the polyhedron lens units 152, 252, and 352. For example, FIGS. 6A-6F respectively illustrates three dimensional views and top views of polyhedron lens units 452a-452f according to some embodiments of the present disclosure. As shown in the three dimensional views of FIGS. 6A-6F, the polyhedron lens unit 452a has a quadrangular prism shape, the polyhedron lens unit 452b has a triangular prism shape, the polyhedron lens unit 452c has a pentagonal prism shape, the polyhedron lens unit 452d has a hexagonal prism shape, the polyhedron lens unit 452e has a cylinder shape, and the polyhedron lens unit 452f has a quadrangular prism shape with round corners. A polyhedron lens film including the polyhedron lens units 452a-452f may increase the light transmittance and reduce the total reflection. It should be noted that the shape of the polyhedron lens units illustrated in FIGS. 6A-6F are exemplary instances, and the polyhedron lens units having other shapes which can scatter the light out of the image sensor are within the scope of the present disclosure.

As shown in FIGS. 4A-5C, the polyhedron lens units 252 and 352 respectively has a microstructure 254 and 354 with a quadrangular pyramid shape in the three dimensional views and a triangular shape in the cross-sectional views. However, the shape of the microstructure of this disclosure is not limited to the shape of the microstructures 254 and 354. For example, FIGS. 7A-7D respectively illustrates cross-sectional views of polyhedron lens units 552a-552h according to some embodiments of the present disclosure. As shown in the cross-sectional view of FIG. 7A, the polyhedron lens unit 552a has a triangular shaped microstructure 554a recessing from the top facet, and the polyhedron lens unit 552b has a triangular shaped microstructure 554b protruding from the top facet. The microstructures 554a and 554b may have a triangular pyramid shape, a quadrangular pyramid shape, a pentagonal pyramid shape, a hexagonal pyramid shape, a cone shape, or the like in three dimensional views. As shown in the cross-sectional view of FIG. 7B, the polyhedron lens unit 552c has a quadrangular shaped microstructure 554c recessing from the top facet, and the polyhedron lens unit 552d has a quadrangular shaped microstructure 554d protruding from the top facet. The microstructures 554c and 554d may have a triangular prism shape, a quadrangular prism shape, a pentagonal prism shape, a hexagonal prism shape, a cylinder shape, or the like in three dimensional views.

Figures 7A, 7B, 7C, 7D:
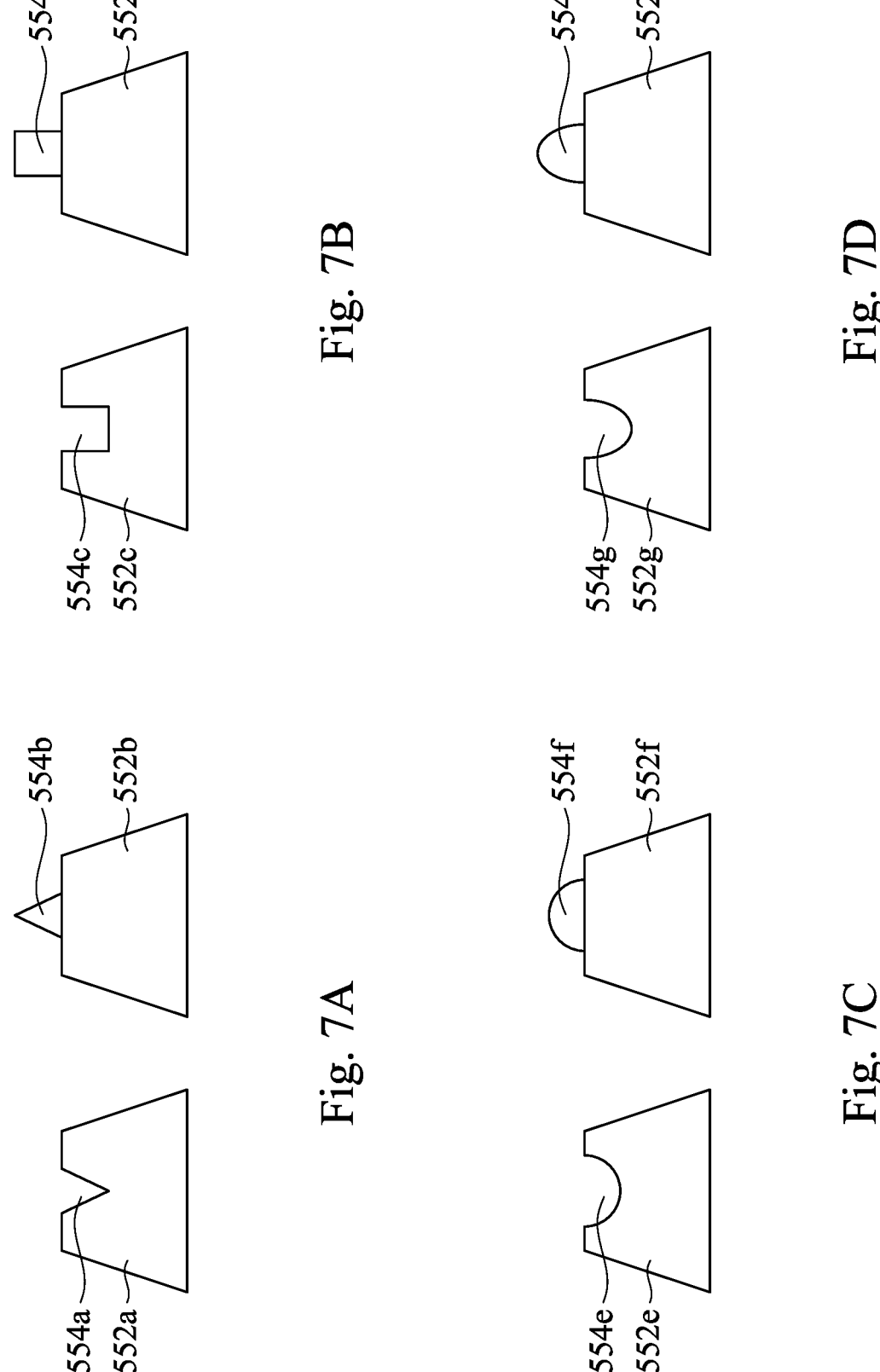
FIGS. 7A-7D illustrate cross-sectional views of polyhedron lens units according to some embodiments of this disclosure.
Figure 8A:
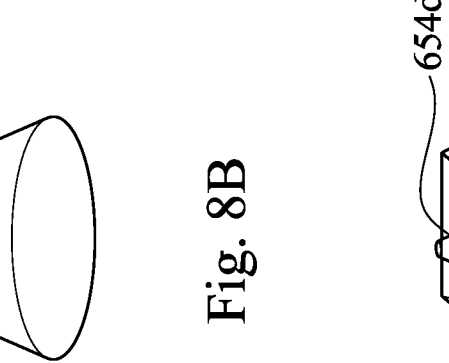
FIGS. 8A-8D illustrate three dimensional views of polyhedron lens units according to some embodiments of this disclosure.
Figure 8B:
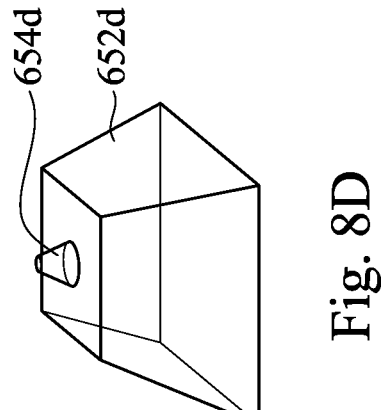
Figure 8C:
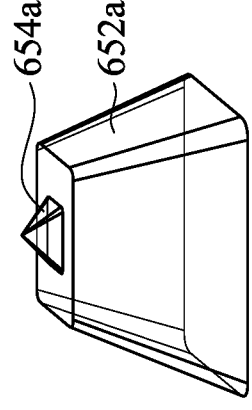
Figure 8D:
Figure 8D:
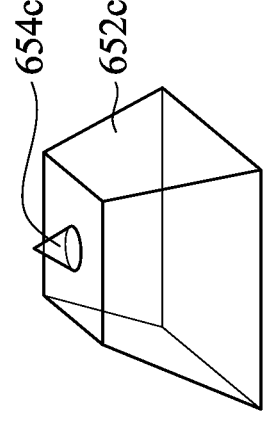

As shown in the cross-sectional view of FIGS. 7C-7D, the polyhedron lens unit 552e has a semicircle shaped microstructure 554e recessing from the top facet, the polyhedron lens unit 552f has a semicircle shaped microstructure 554f protruding from the top facet, the polyhedron lens unit 552g has a semi-oval shaped microstructure 554g recessing from the top facet, and the polyhedron lens unit 552h has a semi-oval shaped microstructure 554h protruding from the top facet. The microstructures 554e and 554f may have a hemispherical shape in three dimensional views, and the microstructures 554g and 554h may have a semi-ellipsoid shape in three dimensional views. It should be noted that the shape of the microstructures illustrated in FIGS. 7A-7D are exemplary instances, and the microstructures having other shapes which can scatter the light out of the image sensor are within the scope of the present disclosure.

In some embodiments, the shape of the microstructure may be different from that of the polyhedron lens unit. For example, as shown in FIGS. 4A-5C, the polyhedron lens units 252 and 352 have a quadrangular prism shape in the three dimensional views, while the microstructures 254 and 354 have a quadrangular pyramid shape. As some other exemplary instances, FIGS. 8A-8D further illustrate cross-sectional views of polyhedron lens units 652a-652d according to some embodiments of the present disclosure. The polyhedron lens unit 652a has a quadrangular prism shape with round corners in the three dimensional views, while the microstructure 654a has a quadrangular pyramid shape. The polyhedron lens unit 652b has a cylinder shape in the three dimensional views, while the microstructure 654b has a cone shape. The polyhedron lens units 652c and 652d have a quadrangular prism shape in the three dimensional views, while the microstructures 654c and 654d respectively has a cone shape and a cylinder shape. It should be noted that the polyhedron lens units and the microstructures having the same shape which can scatter the light out of the image sensor are also within the scope of the present disclosure.

Figure 9:
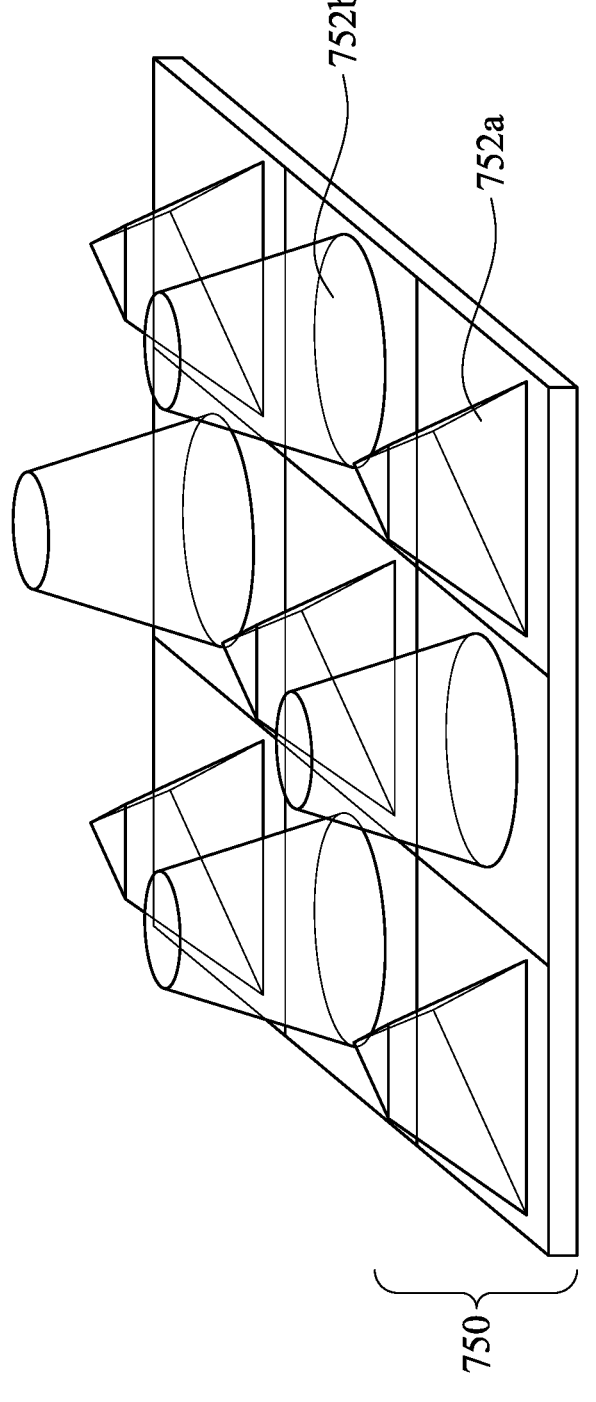
FIG. 9 illustrates a three dimensional view of a polyhedron lens film according to one embodiment of this disclosure.
Figure 9:
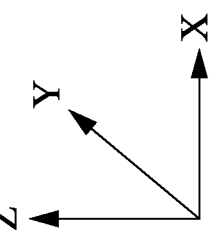

In some embodiments, the polyhedron lens film may include the polyhedron lens units with the same shape, such as the polyhedron lens film 150 shown in FIG. 3A. In some other embodiments, the polyhedron lens film may include a combination of at least two shapes of the polyhedron lens units. Similarly, the polyhedron lens film may include a combination of at least two shapes of the microstructures on the polyhedron lens units. For example, FIG. 9 illustrates a three dimensional view of a polyhedron lens film 750 according to one embodiment of the present disclosure. The polyhedron lens film 750 includes the polyhedron lens units 752a having a triangular prism shape and the polyhedron lens units 752b having a cylinder shape. The polyhedron lens units 752a and the polyhedron lens units 752b are alternately arranged in a two-dimensional array, which increases the transmittance of the polyhedron lens film 750. It should be noted that the two shapes and alternately arrangement of the polyhedron lens units 752a and 752b illustrated in FIG. 9 is an exemplary instance, and the polyhedron lens film having other shapes, other amounts of shapes, and other arrangements which can scatter the light out of the image sensor are within the scope of the present disclosure.

Referring back to FIG. 1, the polyhedron lens film is disposed above the micro lens 140, while some other components may be disposed between the polyhedron lens film 150 and the micro lens 140 or on the polyhedron lens film 150. In some embodiments, the image sensor 10 may include a capping layer 160 on the polyhedron lens film 150. The capping layer 160 may have the hardness higher than that of the polyhedron lens film, which protects and extends the life of the polyhedron lens film 150. As shown in FIG. 1, the capping layer 160 may conformally cover the polyhedron lens film 150, so that the shape of the polyhedron lens units 152 are maintained at the incident surface of the image sensor 10.

In some embodiments, the polyhedron lens film 150 and the capping layer 160 may be formed of dielectric materials such as oxides or resins, while the refractive index of the polyhedron lens film 150 is larger than that of the capping layer 160. This increases the refractive efficiency of the polyhedron lens film 150 and reduces the flare generation of the image sensor 10. In addition, the materials of the polyhedron lens film 150 and the capping layer 160 may have the absorption coefficients at the operating wavelength that are close to zero to improve the sensing accuracy of the image sensor 10.

In some embodiments, the image sensor 10 may include a substrate 170 below the polyhedron lens film 150, so that the bottom surface of the polyhedron lens film 150 physically contacts the substrate 170. The substrate 170 may have sufficient hardness and a flat top surface, which helps the formation of the polyhedron lens film 150 with the polyhedron lens units 152. In some embodiments, the substrate 170 may be formed of dielectric material, resin, glass, or the like, while the refractive index of the substrate 170 approaches to that of the polyhedron lens film 150. In addition, the material of the substrate 170 may have the absorption coefficient at the operating wavelength that is close to zero to improve the sensing accuracy of the image sensor 10. In some embodiments, the substrate 170 may be formed of the same material as that of the polyhedron lens film 150, in which the refractive index of the substrate 170 is the same as that of the polyhedron lens film 150.

In some embodiments, the image sensor 10 may include an optical layer 180 between the micro lens 140 and the polyhedron lens film 150. The optical layer 180 may protect the photodiodes 100 from external moisture or stress from the components above. In some embodiments, the refractive index of the optical layer 180 may be smaller than that of the micro lens 140 to increase the light transmittance from the micro lens 140 out of the image sensor 10, which reduces the flare generation. In addition, the refractive index of the optical layer 180 may be smaller than, equal to, or larger than that of the polyhedron lens film 150.

The cross-sectional view of the image sensor 10 shown in FIG. 1 is taken as an example to depict the arrangement of a polyhedron lens film in an image sensor. However, those skilled in the art should understand that the polyhedron lens film of this disclosure can also be disposed in the image sensors with other component arrangement. FIGS. 10-14 illustrate cross-sectional views of image sensors 20-60 according to some embodiments of this disclosure. The image sensors 20-60 are similar to the image sensor 10 shown in FIG. 1, except for the components arranged between the polyhedron lens film 150 and the micro lens 140.

Figure 10:
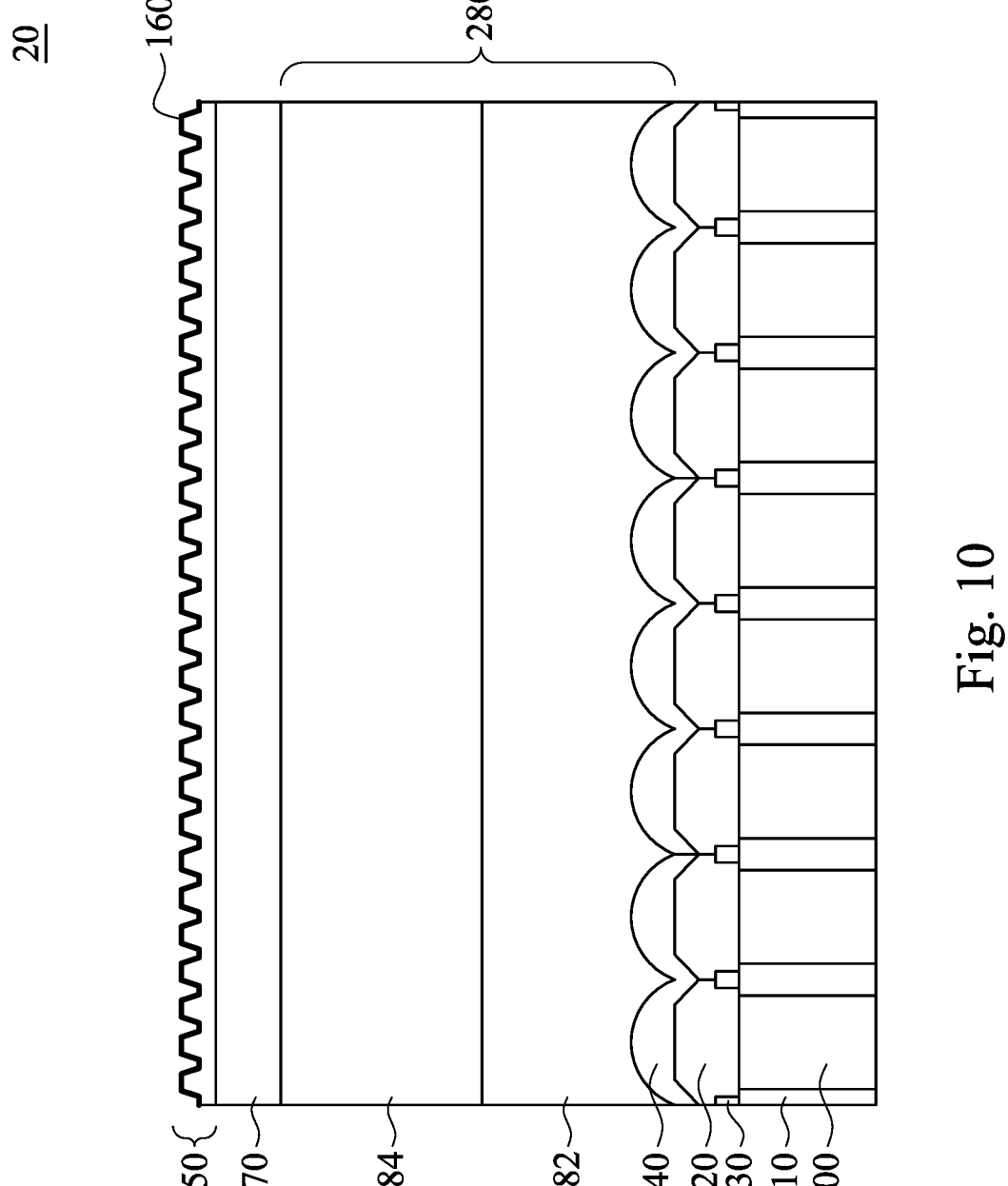
FIGS. 10-14 illustrate cross-sectional views of image sensors according to some embodiments of this disclosure.

As shown in FIG. 10, the image sensor 20 includes an optical layer 280 between the micro lens 140 and the polyhedron lens film 150. The optical layer 280 may include an UV-cut filter 282 and an IR-cut filter 284. When the incident light passes through the optical layer 280, the optical layer 280 may reduce the noise and improve the performance of the image sensor 20. For example, the UV-cut filter 282 may absorb the wavelength smaller than 350 nm while the IR-cut filter 284 may absorb the wavelength larger than 750 nm. In some other embodiments, the optical layer 280 may absorb other wavelength ranges to reduce the noise of the image sensor 20.

Figure 11:
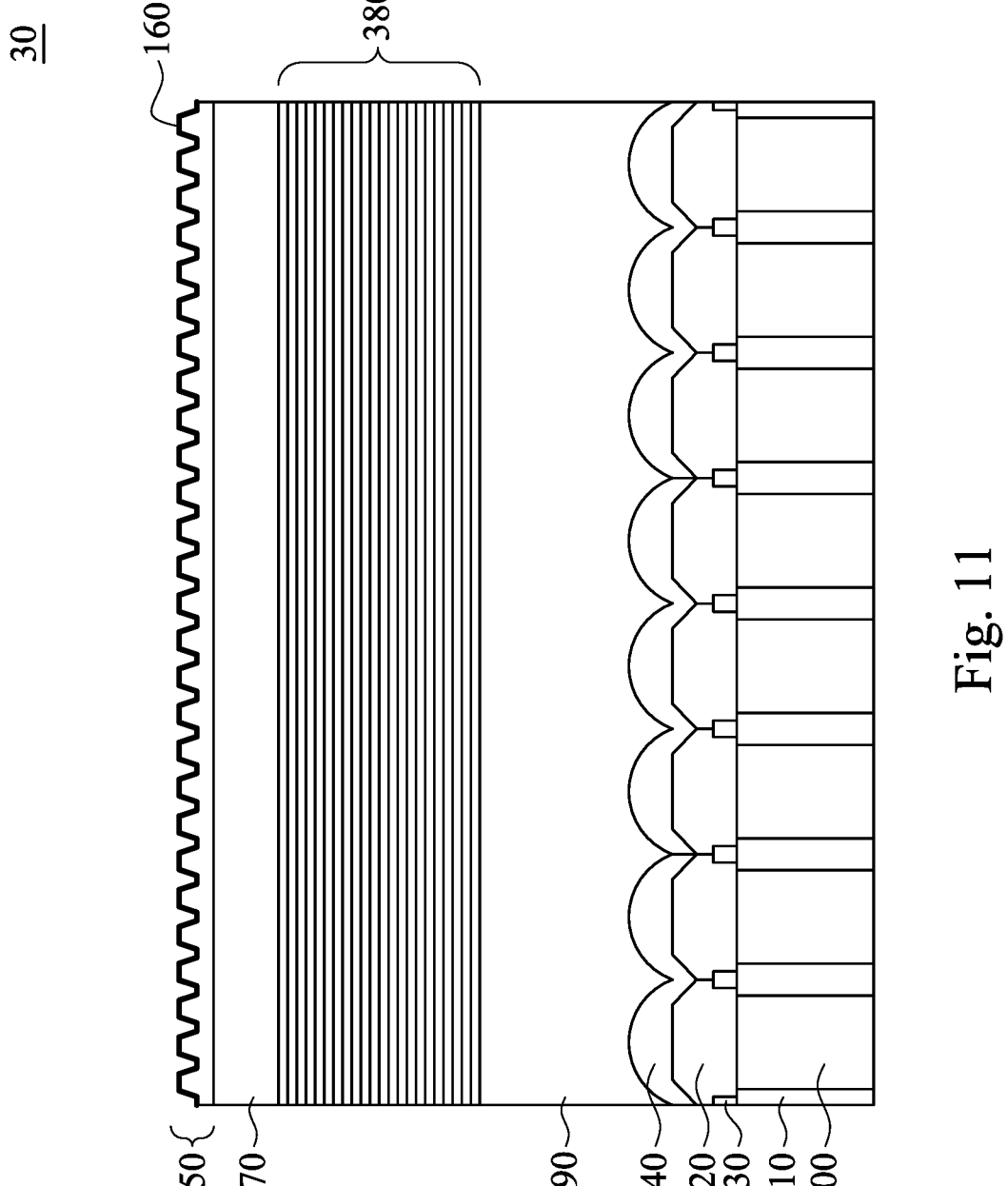

As shown in FIG. 11, the image sensor 30 includes an optical layer 380 between the micro lens 140 and the polyhedron lens film 150, and a buffer layer 390 between the optical layer 380 and the micro lens 140. The optical layer 380 may be a multilayer film including reflective coatings and anti-reflective coatings, so that the optical layer 380 improves the transmittance of the visible light and filters the UV light and/or the IR light. In some embodiments, the buffer layer 390 may have a refractive index smaller than that of the micro lens 140, which increases the light transmittance from the micro lens 140 out of the image sensor 30 and reduces the flare generation. In such embodiments, the refractive index of the micro lens 140 may not need to be adjusted until larger than that of the optical layer 380.

Figure 12:
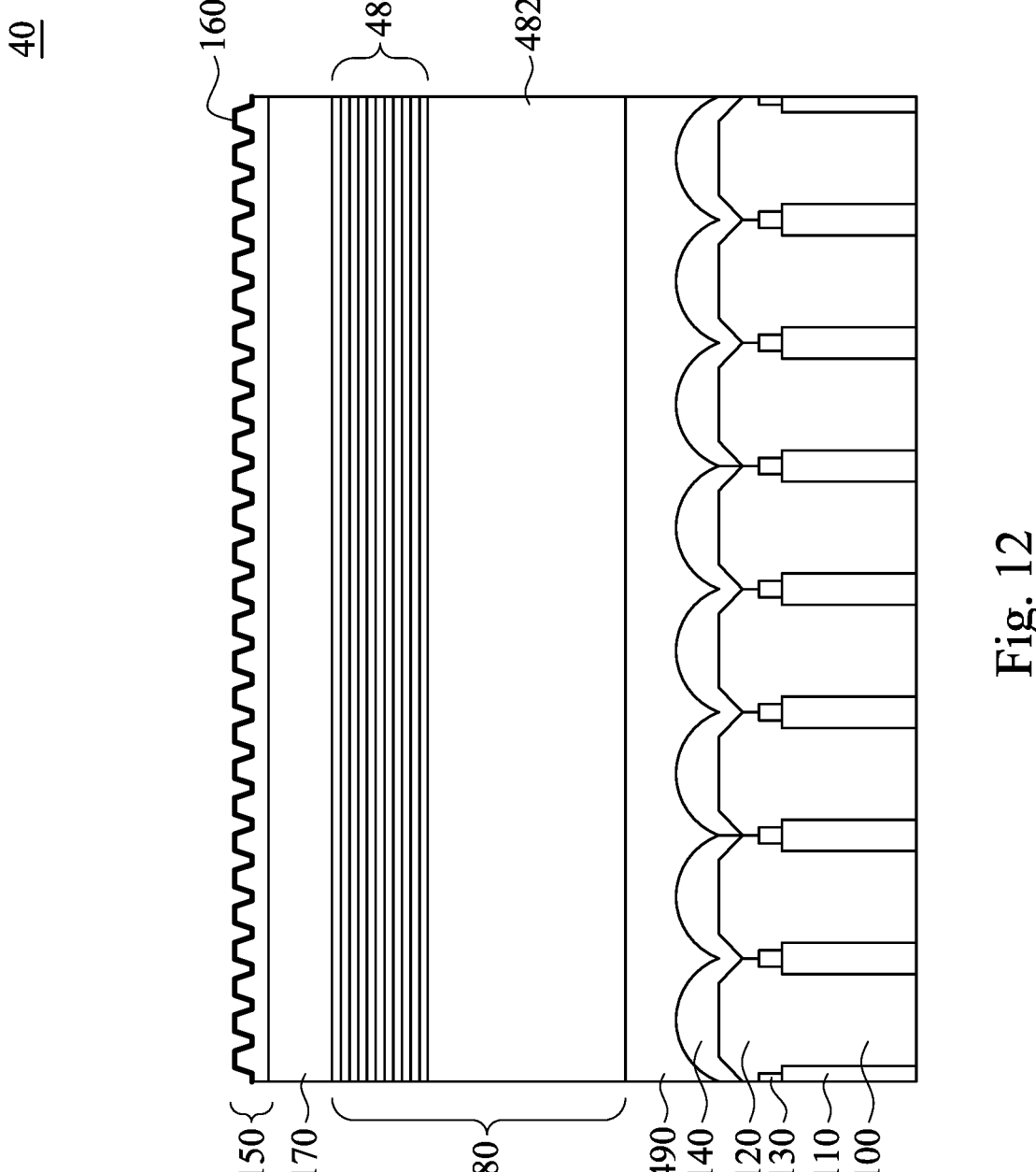

As shown in FIG. 12, the image sensor 40 includes an optical layer 480 between the micro lens 140 and the polyhedron lens film 150, and an adhesive layer 490 between the micro lens 140 and the optical layer 480. The optical layer 480 includes a substrate 482 and a multilayer film 484 similar to that of the optical layer 380 in FIG. 11. The substrate 482 may have sufficient hardness and a flat top surface, which helps the formation of the multilayer film 484. For example, the substrate 482 may be a glass substrate. The adhesive layer 490 may provide strong bonding force between the optical layer 480 and the micro lens 140 to improve the stability of the image sensor 40.

Figure 13:
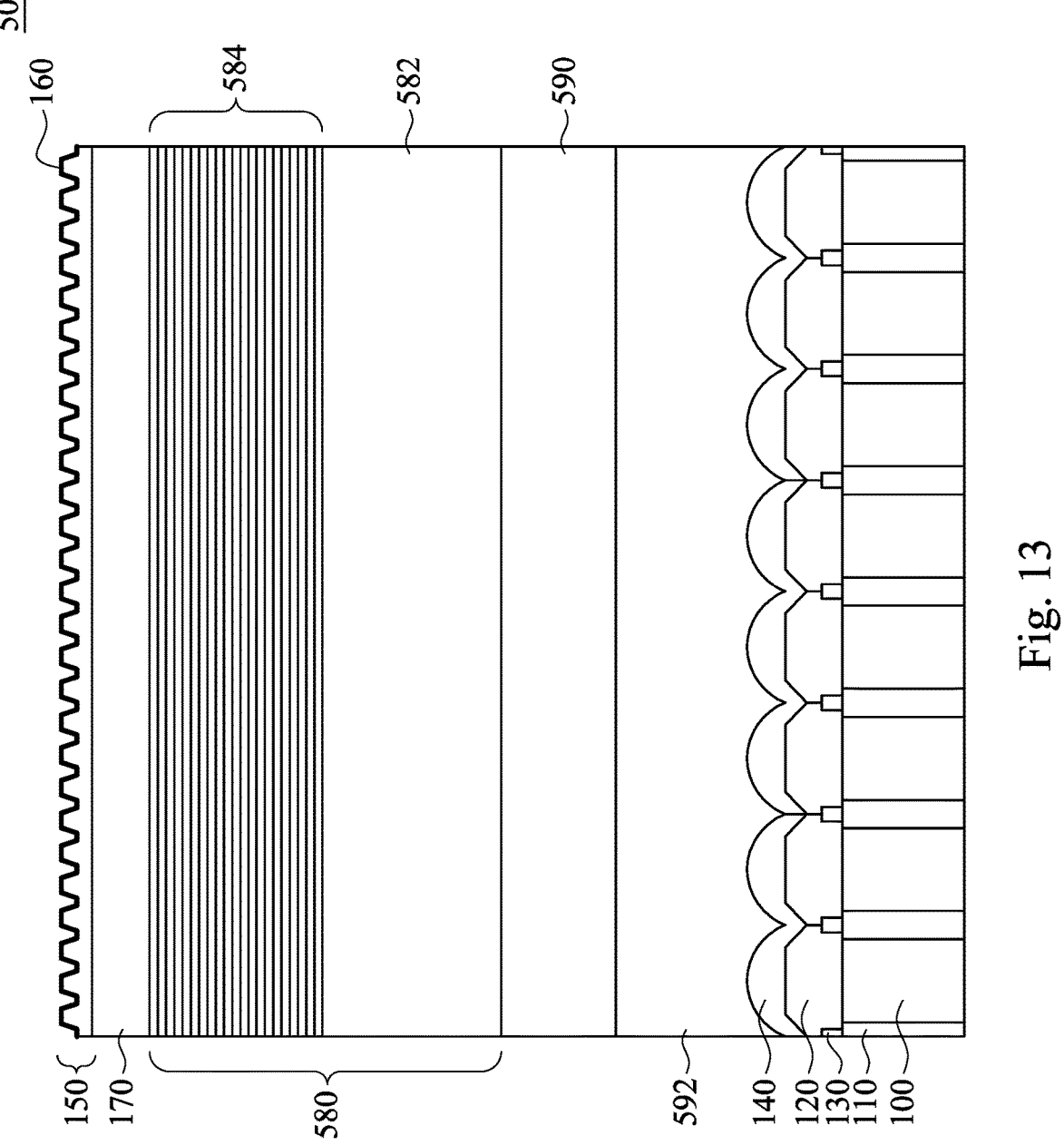

As shown in FIG. 13, the image sensor 50 includes an optical layer 580 between the micro lens 140 and the polyhedron lens film 150, an adhesive layer 590 between the micro lens 140 and the optical layer 580, and a buffer layer 592 between the micro lens 140 and the adhesive layer 590. The optical layer 580 includes a substrate 582 and a multilayer film 584 that are similar to those of the optical layer 480 in FIG. 12. In some embodiments, the adhesive layer 590 may have a high refractive index, which makes it more difficult to provide the micro lens 140 with the refractive index larger than that of the adhesive layer 590. Therefore, the buffer layer 592 may have the refractive index smaller than that of the micro lens 140, which increases the light transmittance from the micro lens 140 out of the image sensor 50 and reduces the flare generation. In such embodiments, the refractive index of the micro lens 140 may not need to be adjusted until larger than that of the adhesive layer 590.

Figure 14:
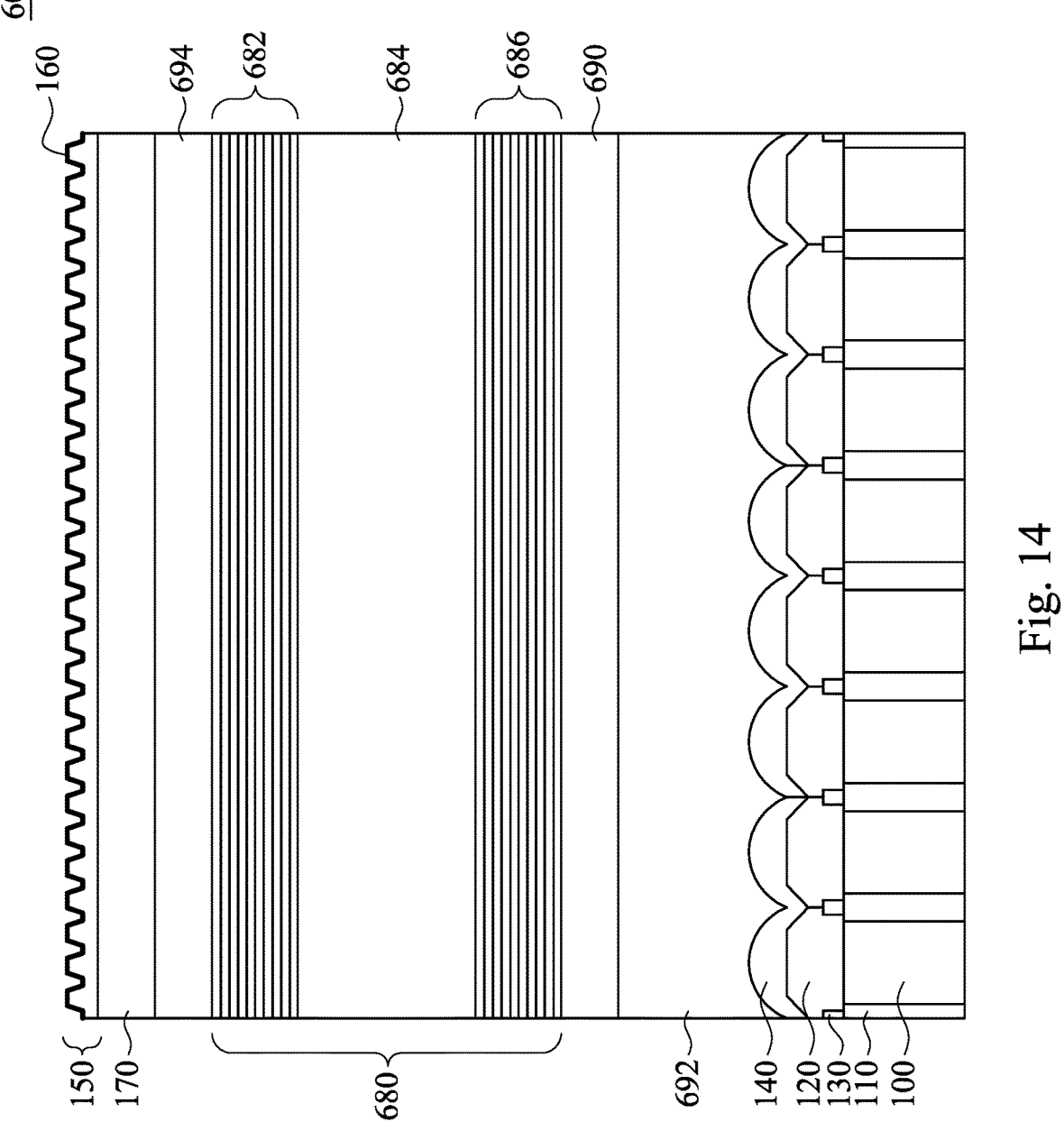

As shown in FIG. 14, the image sensor 60 includes an optical layer 680 between the micro lens 140 and the polyhedron lens film 150, an adhesive layer 690 between the micro lens 140 and the optical layer 680, a buffer layer 692 between the micro lens 140 and the adhesive layer 690, and an adhesive layer 694 between the optical layer 680 and the polyhedron lens film 150. The optical layer 680 may include a first multilayer film 682, a substrate 684 between the micro lens 140 and the first multilayer film 682, and a second multilayer film 686 between the micro lens 140 and the substrate 684 to improve the light transmittance. In some embodiments, the refractive index of the second multilayer film 686 may be smaller than that of the micro lens 140, which increases the light transmittance from the micro lens 140 out of the image sensor 60 and reduces the flare generation. It should be noted that the arrangement of the components in the image sensor 10 illustrated in FIG. 1 and image sensors 20-60 illustrated in FIGS. 10-14 are exemplary instances, and the image sensors having other components which includes a polyhedron lens film above the photodiodes are within the scope of the present disclosure.

According to the above-mentioned embodiments, the image sensor of the present disclosure includes a polyhedron lens film above the micro lens and the photodiode, in which the polyhedron lens film includes a plurality of polyhedron lens units corresponding to one photodiode. The polyhedron lens unit has appropriately size, structure, arrangement, or refractive index, so that the polyhedron lens film increases the light transmittance and reduces the total reflection. Therefore, the flare of the image sensor is reduced, thereby improving the performance of the image sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a photodiode;
a micro lens above the photodiode;
a color filter between the photodiode and the micro lens; and
a polyhedron lens film above the micro lens, wherein the polyhedron lens film comprises a plurality of polyhedron lens units protruding away from the photodiode, wherein a plurality of orthogonal projections of the plurality of the polyhedron lens units are within an orthogonal projection of the photodiode, and wherein each of the plurality of the polyhedron lens units comprises a bottom facet facing the photodiode, a top facet opposite to the bottom facet, and at least one side facet connecting the top facet and the bottom facet.

2. The image sensor of claim 1, wherein an orthogonal projected area of one of the polyhedron lens units onto the photodiode is smaller than or equal to a quarter of an orthogonal projected area of the micro lens onto the photodiode.

3. The image sensor of claim 1, wherein a bottom width of one of the polyhedron lens units is substantially equal to a wavelength of an incident light into the photodiode.

4. The image sensor of claim 1, wherein a ratio between a bottom width and a height of one of the polyhedron lens units is in a range of 1:2 to 1:9.

5. The image sensor of claim 1, wherein a bottom width of one of the polyhedron lens units is larger than a top width, and wherein an angle between the side facet and the bottom facet of the polyhedron lens unit is in a range of 25° to 89°.

6. The image sensor of claim 1, wherein a distance between the bottom facets of adjacent two of the polyhedron lens units is in a range of 0 nm to half of a bottom width of one of the polyhedron lens units.

7. The image sensor of claim 1, wherein the top facet of one of the polyhedron lens units is a flat surface parallel to the bottom facet.

8. The image sensor of claim 1, wherein the top facet of one of the polyhedron lens units comprises a microstructure, and wherein a width of the microstructure is smaller than a top width of the polyhedron lens unit.

9. The image sensor of claim 8, wherein the microstructure protrudes away from the photodiode.

10. The image sensor of claim 8, wherein the microstructure recesses toward the photodiode.

11. The image sensor of claim 8, wherein a shape of the microstructure is different from that of the polyhedron lens unit.

12. The image sensor of claim 8, wherein a ratio between a height of the microstructure and that of the polyhedron lens unit is smaller than or equal to 0.8.

13. The image sensor of claim 1, wherein the polyhedron lens film comprises a combination of at least two shapes of the polyhedron lens units.

14. The image sensor of claim 1, wherein the polyhedron lens units form a two-dimensional array along a first direction and a second direction perpendicular to the first direction.

15. The image sensor of claim 1, further comprising:
a capping layer conformally covering the polyhedron lens film, wherein a refractive index of the polyhedron lens film is larger than that of the capping layer.

16. The image sensor of claim 1, further comprising:
a substrate below the polyhedron lens film, wherein a refractive index of the substrate approaches to that of the polyhedron lens film.

17. The image sensor of claim 1, further comprising:
an optical layer between the micro lens and the polyhedron lens film, wherein a refractive index of the optical layer is smaller than that of the micro lens.

18. The image sensor of claim 1, further comprising:
an optical layer between the micro lens and the polyhedron lens film, wherein the optical layer comprises an IR-cut filter, an UV-cut filter, a reflective coating, an anti-reflective coating, or combinations thereof.

19. The image sensor of claim 1, further comprising:
an optical layer between the micro lens and the polyhedron lens film;
an adhesive layer between the micro lens and the optical layer; and
a buffer layer between the micro lens and the adhesive layer, wherein a refractive index of the buffer layer is smaller than that of the adhesive layer.

20. The image sensor of claim 1, further comprising:
an optical layer between the micro lens and the polyhedron lens film, wherein the optical layer comprises:
a first multilayer film;
a substrate between the micro lens and the first multilayer film; and
a second multilayer film between the micro lens and the substrate, wherein a refractive index of the second multilayer film is smaller than that of the micro lens.

* * * * *